(12) United States Patent
Hughes

(10) Patent No.: US 6,346,176 B1
(45) Date of Patent: Feb. 12, 2002

(54) METHOD OF DEPOSITING THIN FILMS

(75) Inventor: Thomas J. Hughes, Macungie, PA (US)

(73) Assignee: Gentex Optics, Inc., Carbondale, PA (US)

(*) Notice: Subject to any disclaimer, the term of this patent is extended or adjusted under 35 U.S.C. 154(b) by 0 days.

(21) Appl. No.: 08/379,868

(22) Filed: Jan. 27, 1995

(51) Int. Cl.[7] ............................................. C23C 14/34
(52) U.S. Cl. ............................. 204/192.23; 204/192.12; 204/192.15; 204/192.22
(58) Field of Search .................... 204/192.1, 192.12, 204/192.13, 192.15, 192.16, 192.22, 192.23, 192.26, 192.29

(56) References Cited

U.S. PATENT DOCUMENTS

| | | | |
|---|---|---|---|
| 4,693,805 A | * 9/1987 | Quazi | 204/192.22 |
| 4,851,095 A | * 7/1989 | Scobey et al. | 204/192.12 |
| 4,931,169 A | * 6/1990 | Scherer et al. | 204/298.08 |
| 5,122,252 A | * 6/1992 | Latz et al. | 204/192.12 |
| 5,292,417 A | * 3/1994 | Kugler | 204/298.03 |

\* cited by examiner

Primary Examiner—Rodney G. McDonald
(74) Attorney, Agent, or Firm—Shenter & O'Connor

(57) ABSTRACT

A method of building up an oxidized metal coating on a substrate in which the substrate is positioned adjacent a metal target in a chamber containing a low pressure mixture of inert and reactive gases; and a voltage having AC and DC components is applied to the target to sputter onto the substrate a thin layer of elemental metal and oxidized metal. The substrate is then moved to an oxidizing station in the chamber and the layer is subjected to reactive ions, as for example a beam of reactive ions, which oxidizes the elemental metal in the layer. The steps are repeated until an oxidized metal coating of a desired thickness has been built up.

23 Claims, 2 Drawing Sheets

METHOD OF DEPOSITING THIN FILMS

FIELD OF THE INVENTION

The invention is in the field of depositing thin films and, more particularly, relates to a method of depositing thin films by reactive sputtering followed by treatment with reactive ions as for example by a reactive ion beam, both performed in the same atmosphere comprising a mixture of reactive and inert gases.

BACKGROUND OF THE INVENTION

There are many instances, such as in optical applications, in which it is desirable to deposit an oxide film or coating on a substrate. Various methods are known in the prior art for depositing such coatings.

One method known to the prior art is depositing an oxide coating on a substrate by RF sputtering, in which a frequency of the order of 13.56 MHz is applied between the "anode" electrode and the target "cathode" in a highly oxidizing atmosphere.

Quasi Patent 4,693,805 discloses reactive sputtering in which positive DC pulses are applied between the anode and the target in the presence of oxygen. When the voltage difference between the anode and the target is zero, a negative DC voltage pulse is applied between the target and a secondary cathode to discharge oxide layers on the target and eliminate the problem of target arcing. The patentee indicates that low frequency power supplies may be used but always in an atmosphere having a sufficiently high oxygen content that only metal oxide is sputtered and no elemental metal.

SUMMARY OF THE INVENTION

One object of my invention is to provide a method of forming a thin oxide coating more rapidly than is possible in the prior art by sputtering both elemental metal and metal oxide.

Another object of my invention is to provide a method of sputtering a thin oxide coating on a substrate which allows close control of the coating applied.

A still further object of my invention is to provide a method of reactive sputtering at relatively low frequency.

Other and further objects of my invention will appear from the following description.

BRIEF DESCRIPTION OF THE DRAWINGS

In the accompanying drawings to which reference is made in the instant specification and which are to be read in conjunction therewith and in which like reference characters are used to indicate like parts in the various views.

DESCRIPTION OF THE PREFERRED EMBODIMENT

Figure 1:
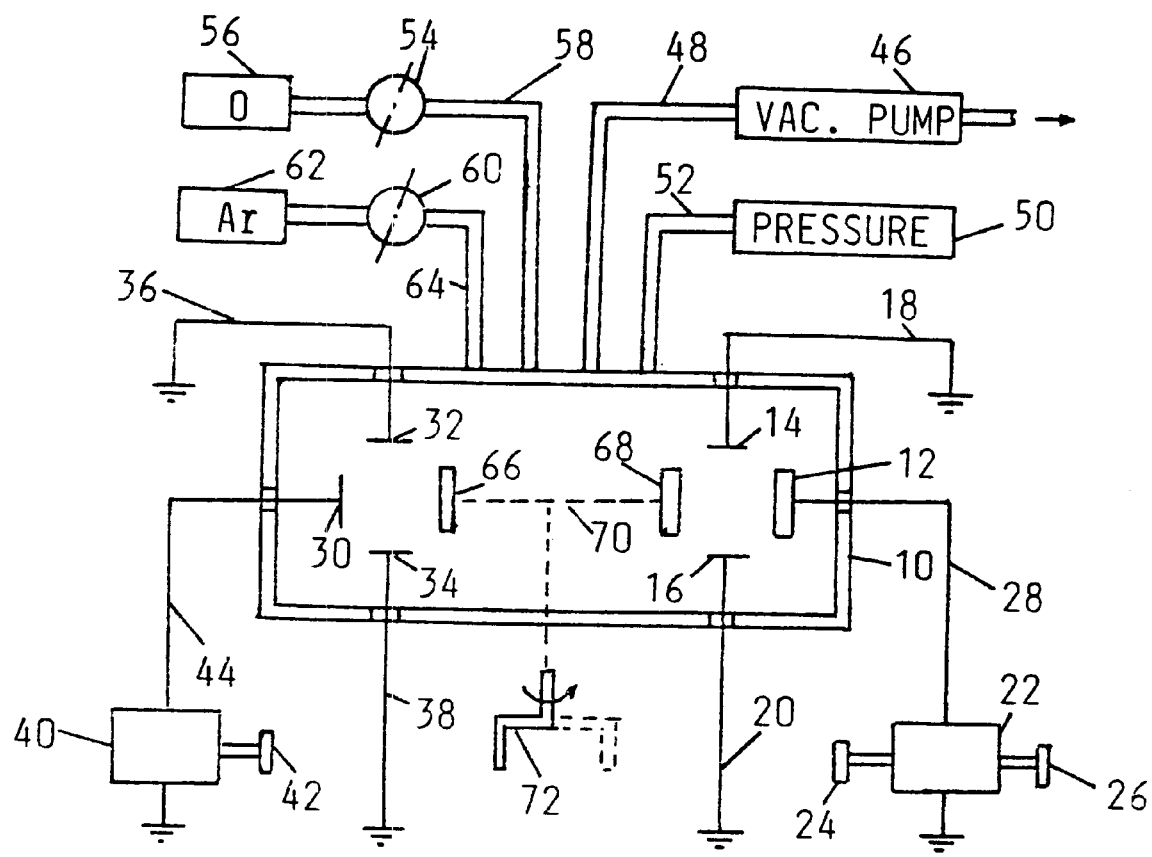
FIG. 1 is a schematic diagram of one form of apparatus which may be used in the practice of my method of sputtering a thin film coating on a substrate.

Referring now to FIG. 1, one form of apparatus which may be used in the practice of my method of sputtering thin oxide coatings includes a gas tight housing 10 made of an insulating material in which a metal target or nominal cathode 12 of aluminum or silicon, for example, is positioned adjacent a pair of nominal anodes 14 and 16 which may for example be cooled stainless steel. Although silicon can be both a metal and a non-metal, it is here to be considered as a metal since it is oxidizable. Conductors 18 and 20 connect the respective anodes 14 and 16 to ground. A combined AC and DC power supply 22 is provided with a ground connection and has a Control 24 for adjusting the AC component and a control 26 for adjusting the DC component. A conductor 28 applies the voltage from the source 22 to the target 12.

A cathode 30 which may, for example, be stainless steel, is disposed adjacent the end of housing 10 remote from target 12 in operative relationship with a pair of anodes 32 and 34 connected to ground by respective conductors 36 and 38. A source 40 of DC voltage is provided with a ground connection and has a control 42 for adjusting the voltage. A conductor 44 applies the voltage from source 40 to the cathode 30.

A vacuum pump 46 connected to the interior of housing 10 by a pipe 48 can be actuated to evacuate the housing 10. A gauge 50 connected to the inside of the housing 10 by a pipe 52 indicates the pressure within the housing.

A valve 54 connected to a source 56 of a reactive gas, such for example as oxygen, is adapted to be operated to admit oxygen into the housing 10 through a pipe 58. A second valve 60 connected to a source 62 of an inert gas, such for example as argon, is adapted to be operated to admit argon into the housing 10 through a pipe 64.

A carrier 70 disposed within the housing is adapted to support two substrates, 66 and 68. Substrate 68 is positioned at a sputtering station adjacent target 12; and substrate 66 is positioned at an oxidizing station adjacent cathode 30. A handle 72 located outside the housing 10 is adapted to be operated to move the two substrates on the carrier 70 between the two positions or stations illustrated in the drawing.

Figure 2:
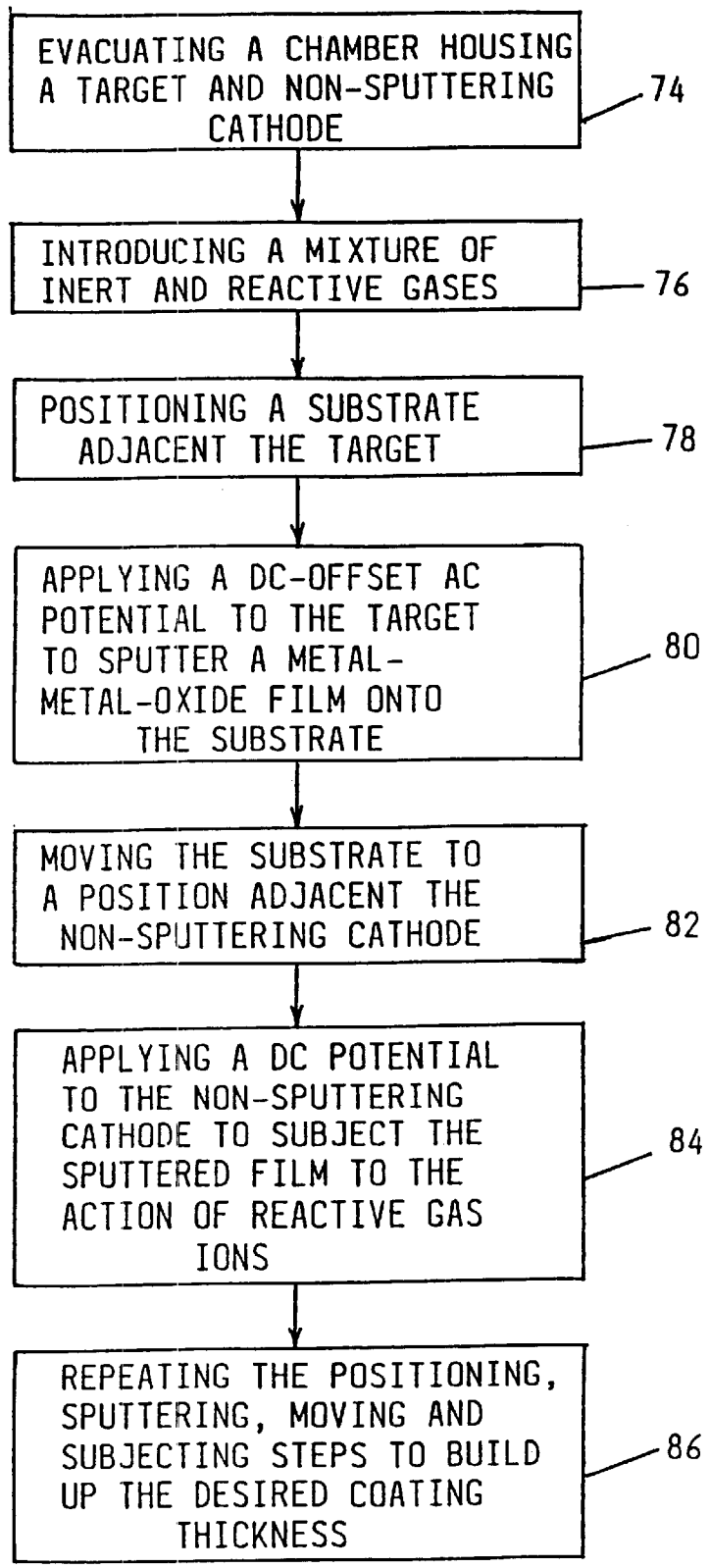
FIG. 2 is a block diagram illustrating the steps which are carried out in the course of my method of sputtering an oxide coating on a substrate.

Referring now to FIG. 2, in the practice of my method I first evacuate the housing 10 by means of the pump 46 as indicated by the block 74. Next, as indicated by block 76, I introduce a mixture of reactive and inert gases into the housing 10. This is done by means of the valves 54 and 60. I so control the relative percentages of oxygen and argon, for example, as to ensure that, in the manner described hereinbelow, some elemental metal, as well as oxidized metal, is sputtered from the target 12 onto the substrate positioned adjacent target 12. It will be understood that the reactive gas need not be oxygen for it to take electrons from, or oxidize, target atoms. More specifically, I control the introduction of the gases so that the portion of reactive gas, such as oxygen, is less than approximately fifty percent by volume of the gas mixture and preferably between 10% and 40% by volume. The pressure of the gas mixture is between about $10^{-1}$ and $10^{-6}$ torr and preferably between $10^{-2}$ and $10^{-4}$ torr.

Next, as is indicated by block 80, I apply a square wave voltage alternating, for example, between plus and minus 300 volts, with a duty cycle such as to produce a DC component of for example −60 to −240 volts between the target 12 and the anodes 14 and 16. This is accomplished by source 22, the AC and DC components of the output of which can be adjusted by controls 24 and 26. For example, the target may be +300 volts for 40% of a cycle and −300 volts for 60% of a cycle to produce a DC component of −60 volts or may be +300 volts for 10% of a cycle and −300 volts for 90% of a cycle to produce a DC component of −240 volts. If the DC component is for example (0.8)(300)=240 volts, then the AC component will be (0.6)(300)=180 volts RMS, and vice versa.

The positive voltage excursions of source 22 may be reduced to +270 volts for example to reduce any slight sputtering of the cooled stainless steel electrodes 14 and 16. Most sputtering from electrode 14 falls onto electrode 16, and vice versa. It will be understood electrodes 14 and 16 may comprise an annular ring, as also may electrodes 32 and 34.

Under the action of the DC voltage component, elemental aluminum, for example, is sputtered from the target 12 directly onto the substrate 68, positioned adjacent the target. Owing to the presence of the reactive gas, oxygen, some aluminum oxide forms on the target 12. The AC voltage component directly sputters this oxide onto the substrate 68.

It will be understood that some of the elemental aluminum sputtered from target 12 onto substrate 68 will be oxidized on the substrate by the reactive gas ions in the plasma at the sputtering station. I preferably sputter so much elemental metal onto the substrate that not all of it can be oxidized by the reactive gas ions at the sputtering station. As a result, a thin film of aluminum oxide and some elemental aluminum is formed on the substrate 68. The frequency of the voltage applied to the target 12 in my method may be very low, as from 25 KHz to 75 KHz. However, for such low frequencies, even the thinnest layers of metal oxide have a high capacitive reactance or impedance which tends to reduce the current and the sputtering rate. Accordingly, I prefer to use a much higher but easily generated frequency of the order of 500 KHz. Source 22 preferably has a relatively low internal impedance. When the target is +300 volts, it is in fact the anode; and electrodes 14 and 16 then serve as cathodes. The positive and negative voltages from source 22 should be appreciably greater than the breakdown voltage of the gas mixture atmosphere so that the discharge is well into the abnormal glow region, but a safe margin below the voltage (or current) at which an arc discharge would be initiated.

After a thin film of aluminum and aluminum oxide has been formed on the substrate 68 positioned adjacent target 12, handle 72 is operated to move substrate 68 to the oxidizing station adjacent cathode 30. This operation is indicated by block 82. Then, as indicated by block 84, a DC potential from the supply 40 is applied to the cathode 30. This potential may for example be −300 volts. Under the action of the DC potential applied to the cathode 30, there are produced oxygen ions which oxidize the elemental metal in the layer on the substrate. It will be understood that source 40 may alternatively provide an AC voltage such, for example, as a symmetrical square wave alternating between +300 and −300 volts. Electrodes 32 and 34 may be formed of stainless steel. For source 40, it is merely necessary to generate a plasma; and the current may be relatively small so as to operate in the normal glow region of the gas mixture. Accordingly, the voltages specified for source 40 are internal or open circuit with no current drain. Source 40 may have a relatively high internal impedance so that the current and external voltage is that associated with a normal glow discharge. For a 25%–75% oxygen-argon mixture by volume, the external voltage for a normal glow discharge is approximately 190 volts. Source 40 and electrodes 30, 32 and 34 may preferably be part of or replaced by an ion beam generator for greater efficiency in oxidizing the elemental metal on the substrate, as for example the linear magnetron ion source shown in Scobey et al Pat. No. 4,851,095. It will be understood that while the sputtered layer on substrate 68 is being fully oxidized, a partially unoxidized layer is being sputtered on substrate 66. The thickness of each layer formed on a substrate is governed by the time it spends at the sputtering station. The thickness of the substrate layers may be made smaller by moving handle 72 back and forth more frequently. This affords a close control of the coating applied. Substrates 66 and 68 may alternatively be mounted on a drum rotating in one direction, in a manner similar to that shown in said Scobey et al patent. By increasing the rotational speed of such drum, the thickness of the layer on substrates 66 and 68 may be reduced.

Finally, as indicated by the block 86, the steps represented by blocks 78, 80, 82 and 84, are repeated until a coating of the desired overall thickness has been built up on substrates 68 and 66.

As the DC component of source 22 is increased, the rate of sputtering of elemental metal is increased. As the proportion of oxygen in the gas mixture is decreased, the rate of sputtering of elemental metal is increased. As the proportion of oxygen in the gas mixture is decreased, the rate of oxidation of sputtered metal at the oxidizing station (as well as at the sputtering station) is decreased. It is desired that the sputtered metal be fully oxidized at the oxidizing station. Since a substrate spends equal amounts of time at the sputtering and oxidizing stations, there is an upper limit on the DC component of source 22 and a lower limit on the proportion of reactive gas in the mixture. It will be further understood that an increase in the DC component of source 22 is accompanied by a decrease in its AC component. If the AC component is too small to completely sputter the metal oxide, then the target will become covered by an oxide coating. An arc discharge will occur for a short interval after the leading edge of each positive and negative voltage excursion. Power supply 22 is preferably provided with current limiting for both positive and negative currents; and, in such event, there will be no damage to components 12, 14, 16 and 22.

It will be seen that I have accomplished the objects of my invention. I have provided a method of sputtering a thin oxide film on a substrate. My method permits a more rapid formation of the coating than do methods of the prior art. My method enables a close control of the coating applied. It permits of reactive sputtering of oxide coatings at relatively low frequencies.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A method of depositing an oxidized metal coating on a substrate in a chamber having throughout an atmosphere comprising a mixture of reactive and inert gases and having a sputtering station and an oxidizing station spaced apart within said chamber, the oxidizing station providing a glow discharge, including the steps of disposing the substrate at the sputtering station and there sputtering onto the substrate from a metal target a layer of elemental metal and oxidized metal, and moving the substrate to the oxidizing station and there subjecting said layer to reactive ions which oxidize the elemental metal in said layer.

2. A method as in claim 1 including repeating said sputtering an d oxidizing steps.

3. A method as in claim 1 including repeating said sputtering and oxidizing steps a plurality of times to build up an oxidized coating of the desired thickness on the substrate.

4. A method as in claim 1 in which said target is aluminum.

5. A method as in claim 1 in which said target is silicon.

6. A method as in claim 1 in which said reactive gas is less than approximately fifty per cent by volume of said atmosphere.

7. A method as in claim 1 in which said reactive gas is between 10 and 40 per cent by volume of said atmosphere.

8. A method as in claim 1 in which said sputtering step comprises applying to said target a voltage having an AC component and a negative DC component.

9. A method as in claim 8 in which the fundamental frequency of said AC component is of the order of magnitude of 500 KHz.

10. A method as in claim 1 in which said sputtering step comprises applying to said target a generally square wave voltage having a positive portion which is less than fifty percent of a cycle and a negative portion which is more than fifty percent of a cycle and provides a negative DC component.

11. A method as in claim 10 wherein the absolute value of the voltage of the positive portion of the square wave does not appreciably exceed that of the negative portion thereof.

12. A method as in claim 10 wherein the voltage is applied from a low-impedance source.

13. A method as in claim 1 wherein the oxidizing station is provided with a non-sputtering cathode including the step of applying to said cathode a negative DC potential.

14. A method as in claim 13 wherein the potential is applied from a high-impedance source.

15. A method as in claim 1 wherein said atmosphere has a pressure between $10^{-1}$ and $10^{-6}$ torr.

16. A method as in claim 1 wherein said atmosphere has a pressure between $10^{-2}$ and $10^{-4}$ torr.

17. A method as in claim 1 wherein the reactive gas is oxygen.

18. A method as in claim 1 wherein the inert gas is argon.

19. A method of depositing oxidized coatings on a pair of substrates in a chamber having throughout an atmosphere comprising a mixture of reactive and inert gases and having a sputtering station and an oxidizing station spaced apart within said chamber, the oxidizing station providing a glow discharge, including the steps of disposing one substrate at the sputtering station and there sputtering onto the substrate from a metal target a layer of elemental metal and oxidized metal, disposing the other substrate at the oxidizing station and there subjecting it to reactive ions which oxidize the metal in any layer of elemental metal and oxidized metal previously sputtered thereon, and repetitively moving the one substrate between the sputtering and oxidizing stations while repetitively moving the other substrate between the oxidizing and sputtering stations.

20. A method of depositing an oxidized metal coating on a substrate in a chamber having throughout an atmosphere comprising a mixture of reactive and inert gases and having a sputtering station comprising an electrode and a target including the steps of disposing the substrate at the sputtering station, applying between the electrode and the target a generally square wave voltage such that the target has a negative voltage relative to the electrode for more than half a cycle and a positive voltage relative to the electrode for less than half a cycle, each of said positive and negative voltages producing discharges well into the abnormal glow region but a safe margin below the voltage at which an arc discharge would be initiated, the positive and negative voltages having absolute values roughly equal to one another, the square wave voltage having a roughly constant RMS value irrespective of its duty cycle, and varying the duty cycle of said square wave voltage to oppositely vary the DC and RMS AC components thereof such that the RMS AC component is sufficiently large to cause complete sputtering of oxide coatings formed on the target.

21. A method as in claim 20 wherein the absolute value of the positive voltage does not appreciably exceed that of the negative voltage.

22. A method as in claim 20 wherein the square wave voltage is applied from a low-impedance source.

23. A method as in claim 20 wherein the square wave voltage is applied from a low-impedance source provided with current limiting.

* * * * *